US 8,146,896 B2

(12) United States Patent  
Cuvalci et al.

(10) Patent No.: US 8,146,896 B2  
(45) Date of Patent: Apr. 3, 2012

(54) CHEMICAL PRECURSOR AMPOULE FOR VAPOR DEPOSITION PROCESSES

(75) Inventors: Olkan Cuvalci, Sunnyvale, CA (US);  
Dien-Yeh Wu, San Jose, CA (US);  
Xiaoxiong Yuan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 726 days.

(21) Appl. No.: 12/263,022

(22) Filed: Oct. 31, 2008

(65) Prior Publication Data

US 2010/0112215 A1    May 6, 2010

(51) Int. Cl.  
*B01F 3/04*    (2006.01)
(52) U.S. Cl. ...................................... 261/121.1; 261/123
(58) Field of Classification Search ............... 261/121.1, 261/123, DIG. 65  
See application file for complete search history.

(56) References Cited

U.S. PATENT DOCUMENTS

| | | | |
|---|---|---|---|
| 2,902,269 A * | 9/1959 | Eichelman ..................... 261/124 |
| 3,429,676 A * | 2/1969 | Gatza .............................. 48/195 |
| 3,844,306 A | 10/1974 | Hill |
| 4,039,639 A * | 8/1977 | Kankel et al. ............... 261/121.1 |
| 4,058,430 A | 11/1977 | Suntola et al. |
| 4,276,243 A | 6/1981 | Partus |
| 4,369,031 A | 1/1983 | Goldman et al. |
| 4,389,973 A | 6/1983 | Suntola et al. |
| 4,413,022 A | 11/1983 | Suntola et al. |
| 4,415,275 A | 11/1983 | Dietrich |
| 4,717,596 A | 1/1988 | Barbee et al. |
| 4,761,269 A | 8/1988 | Conger et al. |
| 4,762,651 A | 8/1988 | Parker et al. |
| 4,783,343 A | 11/1988 | Sato et al. |
| 4,817,557 A | 4/1989 | Diem et al. |
| 4,834,831 A | 5/1989 | Nishizawa et al. |
| 4,911,101 A | 3/1990 | Ballingall, III et al. |
| 4,975,252 A | 12/1990 | Nishizawa et al. |
| 4,993,357 A | 2/1991 | Scholz et al. |
| 5,000,113 A | 3/1991 | Wang et al. |

(Continued)

FOREIGN PATENT DOCUMENTS

EP          0497267          8/1992

(Continued)

OTHER PUBLICATIONS

Chiu, et al. "Synthesis and characterization of organoimido complexes of tantalum; potential single-source precursors to tantalum nitride,"Polyhdedron, vol. 17, Nos. 13-14, pp. 2187-2190, 1998.

(Continued)

*Primary Examiner* — Charles Bushey  
(74) *Attorney, Agent, or Firm* — Patterson & Sheridan, L.L.P.

(57) ABSTRACT

An apparatus for generating a gaseous chemical precursor is provided and contains a canister having a sidewall, a top, and a bottom encompassing an interior volume therein, an inlet port and an outlet port in fluid communication with the interior volume, and an inlet tube extending into the canister and having an inlet end and an outlet end, wherein the inlet end is coupled to the inlet port. The apparatus further contains a gas dispersion plate coupled to the outlet end of the inlet tube, wherein the gas dispersion plate is at an angle within a range from about 3° to about 80°, relative to a horizontal plane which is perpendicular to a vertical axis of the canister.

25 Claims, 6 Drawing Sheets

U.S. PATENT DOCUMENTS

| | | |
|---|---|---|
| 5,027,746 A | 7/1991 | Frijlink et al. |
| 5,098,741 A | 3/1992 | Nolet et al. |
| 5,173,327 A | 12/1992 | Sandhu et al. |
| 5,178,681 A | 1/1993 | Moore et al. |
| 5,188,808 A | 2/1993 | Lilja et al. |
| 5,221,449 A | 6/1993 | Colgan et al. |
| 5,225,251 A | 7/1993 | Esrom et al. |
| 5,225,366 A | 7/1993 | Yoder |
| 5,261,959 A | 11/1993 | Gasworth |
| 5,281,274 A | 1/1994 | Yoder |
| 5,281,485 A | 1/1994 | Colgan et al. |
| 5,294,286 A | 3/1994 | Nishizawa et al. |
| 5,338,362 A | 8/1994 | Imahashi et al. |
| 5,354,516 A | 10/1994 | Tomita et al. |
| 5,374,570 A | 12/1994 | Nasu et al. |
| 5,377,429 A | 1/1995 | Sandhu et al. |
| 5,381,605 A | 1/1995 | Krafft |
| 5,441,703 A | 8/1995 | Jurgensen et al. |
| 5,443,647 A | 8/1995 | Aucoin et al. |
| 5,480,818 A | 1/1996 | Matsumoto et al. |
| 5,483,919 A | 1/1996 | Yokoyama et al. |
| 5,496,408 A | 3/1996 | Motoda et al. |
| 5,503,875 A | 4/1996 | Imai et al. |
| 5,558,717 A | 9/1996 | Zhao et al. |
| 5,595,603 A | 1/1997 | Klinedinst et al. |
| 5,595,691 A * | 1/1997 | Hsu ............................ 261/120 |
| 5,620,524 A | 4/1997 | Fan et al. |
| 5,630,878 A | 5/1997 | Miyamoto et al. |
| 5,645,642 A | 7/1997 | Nishizato et al. |
| 5,674,574 A | 10/1997 | Atwell et al. |
| 5,674,786 A | 10/1997 | Turner et al. |
| 5,711,811 A | 1/1998 | Suntola et al. |
| 5,730,802 A | 3/1998 | Ishizumi et al. |
| 5,764,849 A | 6/1998 | Atwell |
| 5,796,116 A | 8/1998 | Nakata et al. |
| 5,807,792 A | 9/1998 | Ilg et al. |
| 5,820,678 A | 10/1998 | Hubert et al. |
| 5,835,677 A | 11/1998 | Li et al. |
| 5,846,332 A | 12/1998 | Zhao et al. |
| 5,855,680 A | 1/1999 | Soininen et al. |
| 5,879,459 A | 3/1999 | Gadgil et al. |
| 5,882,411 A | 3/1999 | Zhao et al. |
| 5,882,416 A | 3/1999 | Van Buskirk et al. |
| 5,906,683 A | 5/1999 | Chen et al. |
| 5,916,365 A | 6/1999 | Sherman |
| 5,923,056 A | 7/1999 | Lee et al. |
| 5,942,089 A | 8/1999 | Sproul et al. |
| 5,951,771 A | 9/1999 | Raney et al. |
| 5,966,499 A | 10/1999 | Hinkle et al. |
| 5,968,588 A | 10/1999 | Sivaramakrishnan et al. |
| 5,972,430 A | 10/1999 | DiMeo, Jr. et al. |
| 6,015,590 A | 1/2000 | Suntola et al. |
| 6,015,595 A | 1/2000 | Felts |
| 6,015,917 A | 1/2000 | Bhandari et al. |
| 6,042,652 A | 3/2000 | Hyun et al. |
| 6,066,358 A | 5/2000 | Guo et al. |
| 6,071,572 A | 6/2000 | Mosely et al. |
| 6,077,396 A | 6/2000 | LaRiviere |
| 6,079,356 A | 6/2000 | Umotoy et al. |
| 6,084,302 A | 7/2000 | Sandhu |
| 6,099,904 A | 8/2000 | Mak et al. |
| 6,107,198 A | 8/2000 | Lin et al. |
| 6,124,158 A | 9/2000 | Dautartas et al. |
| 6,136,725 A | 10/2000 | Loan et al. |
| 6,139,640 A | 10/2000 | Ramos et al. |
| 6,139,700 A | 10/2000 | Kang et al. |
| 6,143,080 A | 11/2000 | Bartholomew et al. |
| 6,143,082 A | 11/2000 | McInerney et al. |
| 6,144,060 A | 11/2000 | Park et al. |
| 6,156,382 A | 12/2000 | Rajagopalan et al. |
| 6,162,488 A | 12/2000 | Gevelber et al. |
| 6,162,715 A | 12/2000 | Mak et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,189,323 B1 | 2/2001 | Nakamura et al. |
| 6,197,683 B1 | 3/2001 | Kang et al. |
| 6,200,893 B1 | 3/2001 | Sneh |
| 6,202,991 B1 * | 3/2001 | Coniglio et al. ............ 261/121.1 |
| 6,203,613 B1 | 3/2001 | Gates et al. |
| 6,206,967 B1 | 3/2001 | Mak et al. |
| 6,207,487 B1 | 3/2001 | Kim et al. |
| 6,224,681 B1 | 5/2001 | Sivaramakrishnan et al. |
| 6,231,672 B1 | 5/2001 | Choi et al. |
| 6,248,434 B1 | 6/2001 | Rodiger et al. |
| 6,251,190 B1 | 6/2001 | Mak et al. |
| 6,270,572 B1 | 8/2001 | Kim et al. |
| 6,271,148 B1 | 8/2001 | Kao et al. |
| 6,284,646 B1 | 9/2001 | Leem et al. |
| 6,287,965 B1 | 9/2001 | Kang et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,328,221 B1 | 12/2001 | Moore et al. |
| 6,342,277 B1 | 1/2002 | Sherman |
| 6,348,376 B2 | 2/2002 | Lim et al. |
| 6,358,829 B2 | 3/2002 | Yoon et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,433,314 B1 | 8/2002 | Mandrekar et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,454,860 B2 | 9/2002 | Metzner et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,511,539 B1 | 1/2003 | Raaijmakers et al. |
| 6,524,952 B1 | 2/2003 | Srinivas et al. |
| 6,548,112 B1 | 4/2003 | Hillman et al. |
| 6,551,406 B2 | 4/2003 | Kilpi et al. |
| 6,551,929 B1 | 4/2003 | Kori et al. |
| 6,561,498 B2 | 5/2003 | Tompkins et al. |
| 6,569,501 B2 | 5/2003 | Chiang et al. |
| 6,572,705 B1 | 6/2003 | Suntola et al. |
| 6,578,287 B2 | 6/2003 | Aswad |
| 6,579,372 B2 | 6/2003 | Park |
| 6,585,823 B1 | 7/2003 | Van Wijck et al. |
| 6,593,484 B2 | 7/2003 | Yasuhara et al. |
| 6,596,602 B2 | 7/2003 | Iizuka et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,630,030 B1 | 10/2003 | Suntola et al. |
| 6,630,201 B2 | 10/2003 | Chiang et al. |
| 6,632,279 B1 | 10/2003 | Ritala et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,720,027 B2 | 4/2004 | Yang et al. |
| 6,730,267 B2 | 5/2004 | Stringer et al. |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,784,096 B2 | 8/2004 | Chen et al. |
| 6,790,773 B1 | 9/2004 | Drewery et al. |
| 6,797,108 B2 | 9/2004 | Wendling |
| 6,800,173 B2 | 10/2004 | Chiang et al. |
| 6,803,272 B1 | 10/2004 | Halliyal et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,827,815 B2 | 12/2004 | Hytros et al. |
| 6,838,125 B2 | 1/2005 | Chung et al. |
| 6,866,746 B2 | 3/2005 | Lei et al. |

| Patent Number | Date | Name |
|---|---|---|
| 6,866,951 B2 | 3/2005 | Foley et al. |
| 6,868,859 B2 | 3/2005 | Yudovsky |
| 6,878,206 B2 | 4/2005 | Tzu et al. |
| 6,881,437 B2 | 4/2005 | Ivanov et al. |
| 6,893,915 B2 | 5/2005 | Park et al. |
| 6,902,624 B2 | 6/2005 | Seidel et al. |
| 6,905,541 B2 | 6/2005 | Chen et al. |
| 6,905,610 B2 * | 6/2005 | Turchet et al. ............. 210/760 |
| 6,911,093 B2 | 6/2005 | Stacey et al. |
| 6,915,592 B2 | 7/2005 | Guenther |
| 6,921,062 B2 | 7/2005 | Gregg et al. |
| 6,946,033 B2 | 9/2005 | Tsuei et al. |
| 6,955,211 B2 | 10/2005 | Ku et al. |
| 6,983,892 B2 | 1/2006 | Noorbakhsh et al. |
| 6,998,014 B2 | 2/2006 | Chen et al. |
| 7,066,194 B2 | 6/2006 | Ku et al. |
| 7,186,385 B2 | 3/2007 | Ganguli et al. |
| 7,195,026 B2 | 3/2007 | Znamensky et al. |
| 7,228,873 B2 | 6/2007 | Ku et al. |
| 7,237,565 B2 | 7/2007 | Hioki et al. |
| 7,270,709 B2 | 9/2007 | Chen et al. |
| 7,294,208 B2 | 11/2007 | Guenther |
| 7,300,038 B2 | 11/2007 | Gregg et al. |
| 7,429,361 B2 * | 9/2008 | Ganguli et al. |
| 7,926,791 B1 * | 4/2011 | Bertoli ............. 261/63 |
| 2001/0000866 A1 | 5/2001 | Sneh et al. |
| 2001/0002280 A1 | 5/2001 | Sneh |
| 2001/0003603 A1 | 6/2001 | Eguchi et al. |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0007790 A1 | 1/2002 | Park |
| 2002/0009544 A1 | 1/2002 | Mcfeely et al. |
| 2002/0009896 A1 | 1/2002 | Sandhu et al. |
| 2002/0013051 A1 | 1/2002 | Hautala et al. |
| 2002/0017242 A1 | 2/2002 | Hamaguchi et al. |
| 2002/0020869 A1 | 2/2002 | Park et al. |
| 2002/0021544 A1 | 2/2002 | Cho et al. |
| 2002/0031618 A1 | 3/2002 | Sherman |
| 2002/0041931 A1 | 4/2002 | Suntola et al. |
| 2002/0048635 A1 | 4/2002 | Kim et al. |
| 2002/0052097 A1 | 5/2002 | Park |
| 2002/0060363 A1 | 5/2002 | Xi et al. |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0086106 A1 | 7/2002 | Park et al. |
| 2002/0086111 A1 | 7/2002 | Byun et al. |
| 2002/0086507 A1 | 7/2002 | Park et al. |
| 2002/0092471 A1 | 7/2002 | Kang et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0106846 A1 | 8/2002 | Seutter et al. |
| 2002/0108570 A1 | 8/2002 | Lindfors |
| 2002/0110991 A1 | 8/2002 | Li |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0127336 A1 | 9/2002 | Chen et al. |
| 2002/0127745 A1 | 9/2002 | Lu et al. |
| 2002/0132473 A1 | 9/2002 | Chiang et al. |
| 2002/0134307 A1 | 9/2002 | Choi |
| 2002/0144596 A1 | 10/2002 | Dee et al. |
| 2002/0144655 A1 | 10/2002 | Chiang et al. |
| 2002/0144657 A1 | 10/2002 | Chiang et al. |
| 2002/0145210 A1 | 10/2002 | Tompkins et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0197402 A1 | 12/2002 | Chiang et al. |
| 2003/0004723 A1 | 1/2003 | Chihara |
| 2003/0010451 A1 | 1/2003 | Tzu et al. |
| 2003/0013320 A1 | 1/2003 | Kim et al. |
| 2003/0017697 A1 | 1/2003 | Choi et al. |
| 2003/0022338 A1 | 1/2003 | Ruben et al. |
| 2003/0023338 A1 | 1/2003 | Chin et al. |
| 2003/0031807 A1 | 2/2003 | Elers et al. |
| 2003/0038369 A1 | 2/2003 | Layadi et al. |
| 2003/0042630 A1 | 3/2003 | Babcoke et al. |
| 2003/0049375 A1 | 3/2003 | Nguyen et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072913 A1 | 4/2003 | Chou et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0082301 A1 | 5/2003 | Chen et al. |
| 2003/0082307 A1 | 5/2003 | Chung et al. |
| 2003/0089308 A1 | 5/2003 | Raaijmakers |
| 2003/0101927 A1 | 6/2003 | Raaijmakers |
| 2003/0101938 A1 | 6/2003 | Ronsse et al. |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121241 A1 | 7/2003 | Belke |
| 2003/0121469 A1 | 7/2003 | Lindfors et al. |
| 2003/0121608 A1 | 7/2003 | Chen et al. |
| 2003/0121609 A1 | 7/2003 | Ohmi et al. |
| 2003/0124262 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0144657 A1 | 7/2003 | Bowe et al. |
| 2003/0153177 A1 | 8/2003 | Tepman et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190804 A1 | 10/2003 | Glenn et al. |
| 2003/0194493 A1 | 10/2003 | Chang et al. |
| 2003/0198740 A1 | 10/2003 | Wendling |
| 2003/0198754 A1 | 10/2003 | Xi et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2003/0235961 A1 | 12/2003 | Metzner et al. |
| 2004/0005749 A1 | 1/2004 | Choi et al. |

| | | | |
|---|---|---|---|
| 2004/0009307 A1 | 1/2004 | Koh et al. | |
| 2004/0011404 A1 | 1/2004 | Ku et al. | |
| 2004/0011504 A1 | 1/2004 | Ku et al. | |
| 2004/0013577 A1 | 1/2004 | Ganguli et al. | |
| 2004/0014320 A1 | 1/2004 | Chen et al. | |
| 2004/0015300 A1 | 1/2004 | Ganguli et al. | |
| 2004/0016404 A1 | 1/2004 | Gregg et al. | |
| 2004/0018304 A1 | 1/2004 | Chung et al. | |
| 2004/0018723 A1 | 1/2004 | Byun et al. | |
| 2004/0018747 A1 | 1/2004 | Lee et al. | |
| 2004/0025370 A1 | 2/2004 | Guenther | |
| 2004/0033698 A1 | 2/2004 | Lee et al. | |
| 2004/0046197 A1 | 3/2004 | Basceri et al. | |
| 2004/0065255 A1 | 4/2004 | Yang et al. | |
| 2004/0069227 A1 | 4/2004 | Ku et al. | |
| 2004/0071897 A1 | 4/2004 | Verplancken et al. | |
| 2004/0077183 A1 | 4/2004 | Chung | |
| 2004/0144308 A1 | 7/2004 | Yudovsky | |
| 2004/0144311 A1 | 7/2004 | Chen et al. | |
| 2004/0170403 A1 | 9/2004 | Lei | |
| 2004/0187304 A1 | 9/2004 | Chen et al. | |
| 2004/0203254 A1 | 10/2004 | Conley et al. | |
| 2004/0219784 A1 | 11/2004 | Kang et al. | |
| 2004/0224506 A1 | 11/2004 | Choi et al. | |
| 2004/0235285 A1 | 11/2004 | Kang et al. | |
| 2004/0253375 A1 | 12/2004 | Ivanov et al. | |
| 2004/0256351 A1 | 12/2004 | Chung et al. | |
| 2004/0256745 A1* | 12/2004 | Simler | 261/121.1 |
| 2005/0006799 A1 | 1/2005 | Gregg et al. | |
| 2005/0009325 A1 | 1/2005 | Chung et al. | |
| 2005/0059240 A1 | 3/2005 | Choi et al. | |
| 2005/0064207 A1 | 3/2005 | Senzaki et al. | |
| 2005/0070126 A1 | 3/2005 | Senzaki | |
| 2005/0095859 A1 | 5/2005 | Chen et al. | |
| 2005/0104142 A1 | 5/2005 | Narayanan et al. | |
| 2005/0153571 A1 | 7/2005 | Senzaki | |
| 2005/0189072 A1 | 9/2005 | Chen et al. | |
| 2005/0233156 A1 | 10/2005 | Senzaki et al. | |
| 2005/0255243 A1 | 11/2005 | Senzaki | |
| 2005/0257735 A1 | 11/2005 | Guenther | |
| 2006/0257295 A1 | 11/2006 | Chen et al. | |
| 2007/0067609 A1 | 3/2007 | Chen et al. | |
| 2007/0079759 A1 | 4/2007 | Lee et al. | |
| 2007/0089817 A1 | 4/2007 | Ganguli et al. | |
| 2007/0110898 A1 | 5/2007 | Ganguli et al. | |
| 2007/0235085 A1 | 10/2007 | Nakashima et al. | |
| 2008/0044573 A1 | 2/2008 | Chen et al. | |
| 2008/0099933 A1 | 5/2008 | Choi et al. | |
| 2008/0149031 A1 | 6/2008 | Chu et al. | |
| 2008/0216743 A1 | 9/2008 | Chen et al. | |
| 2009/0011129 A1 | 1/2009 | Ganguli et al. | |

FOREIGN PATENT DOCUMENTS

| | | |
|---|---|---|
| EP | 1077484 | 2/2001 |
| EP | 1079001 | 2/2001 |
| EP | 1167569 | 1/2002 |
| GB | 2151662 | 7/1985 |
| GB | 2223509 | 4/1990 |
| GB | 2355727 | 5/2001 |
| JP | 56035426 | 4/1981 |
| JP | 58098917 | 6/1983 |
| JP | 01175225 | 7/1989 |
| JP | 04291916 | 10/1992 |
| JP | 05047666 | 2/1993 |
| JP | 05206036 | 8/1993 |
| JP | 05234899 | 9/1993 |
| JP | 05270997 | 10/1993 |
| JP | 06224138 | 8/1994 |
| JP | 06317520 | 11/1994 |
| JP | 07300649 | 11/1995 |
| JP | 2000122725 | 4/2000 |
| JP | 2000212752 | 8/2000 |
| JP | 2000319772 | 11/2000 |
| JP | 2001020075 | 1/2001 |
| JP | 2001111000 | 4/2001 |
| JP | 2001172767 | 6/2001 |
| WO | WO-9617107 | 6/1996 |
| WO | WO-9901595 | 1/1999 |
| WO | WO-9929924 | 6/1999 |
| WO | WO-9965064 | 12/1999 |
| WO | WO-0016377 | 3/2000 |
| WO | WO-0054320 | 9/2000 |
| WO | WO-0079575 | 12/2000 |
| WO | WO-0079576 | 12/2000 |
| WO | WO-0115220 | 3/2001 |
| WO | WO-0117692 | 3/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0136702 | 5/2001 |
| WO | WO-0166832 | 9/2001 |
| WO | WO-0201628 | 1/2002 |
| WO | WO-0208485 | 1/2002 |
| WO | WO-0208488 | 1/2002 |
| WO | WO-0243115 | 5/2002 |
| WO | WO-0245167 | 6/2002 |
| WO | WO-0245871 | 6/2002 |
| WO | WO-0246489 | 6/2002 |
| WO | WO-03004723 | 1/2003 |
| WO | WO-03023835 | 3/2003 |
| WO | WO-2004008491 | 1/2004 |
| WO | WO-2004106584 | 12/2004 |

OTHER PUBLICATIONS

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc., vol. 670, Materials Research Society, (2001), pp. K2.2.1-K2.2.6.

Eisenbraun, et al. "Atomic Layer Deposition (ALD) of Tantalum-based materials for zero thickness copper barrier applications," Proceedings of the IEEE 2001 International Interconnect Technology Conference, 2001, pp. 207-209.

Goswami, et al. Transition Metals Show Promise as Copper Barriers, Semiconductor International, ATMI, San Jose—May 1, 2004.

Hartje, et al. "CVD reactor source—has irradiated surface to vaporize surface of reaction component held solid by internal cooling," Patent No. DD 274057, Dec. 6, 1956, AKAD Wissenschaften DDR, Derwent WPI File, Record No. 008261396, Abstract.

Hiltunen, et al. "Nitrides of Titanium, Niobium, Tantalum and Molybdenum Grown as Thin Films by the Atomic Layer Epitaxy Method," Thin Solid Films, vol. 166, (1988), pp. 149-154.

Hong, et al. "Characteristics of PAALD-TaN thin films derived from TAIMATA precursor for copper metallization," Internconnect Technology Conference, 2004, Proceedings of the IEEE 2004 International, Jun. 7-9, 2004, pp. 9-11.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670-1675.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, pp. 236-242.

Kukli, et al. "Properties of $\{Nb_{1-x}Ta_x\}_2O_5$ Solid Solutions and $\{Nb_{1-x}Ta_x\}_2O_5ZrO_2$ Nanolaminates Grown by Atomic Layer Epitaxy," 1997; pp. 785-793.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; p. 300-306.

Kukli, et al. "Tailoring the Dielectric Properties of $HfO_2$-$Ta_2$-$O_5$ Nanolaminates," Applied Physics Letters, vol. 68, No. 26, Jun. 24, 1996; p. 3737-3739.

Leskela, et al. "Atomic Layer Epitaxy in Deposition of Various Oxide and Nitride Thin Films," Journal De Physique IV, Colloque C5, Supplement au Journal de Physique II, vol. 5, Jun. 1995, pp. C5-937-C5-951.

NEC Corp. "Gasifier for sublimation for CVD unit—has container for solid material, 1.sup.st heater, 2.sup.nd heater to heat gas trapped by mesh structure, etc.," Patent No. 5-214537, Aug. 24, 1993, Derwent WPI File, Record No. 009606474, Abstract.

Niinisto, et al. "Synthesis of Oxide Thin Films and Overlayers by Atomic Layer Epitaxy for Advanced Applicaitions," Materials Science and Engineering B41 (1996), 23-29.

Pamplin "Crystal Growth," MBE-Molecular Beam Epitaxial Evaporative Growth, Pergamon Press, Sec. Edition, vol. 16, 1981, pp. 227-229.

Park, et al. "Performance improvement of MOSFET with $HfO_2Al_2O_3$ laminate gate dielectric and CVD-TaN metal gate deposited by TAIMATA", Electron Devices Meeting, 2003. IEDM '03 Technical Digest. IEEE International Dec. 8-10, 2003, pp. 13.6.1-13.6.4.

PCT International Preliminary Report on Patentability and, Written Opinion dated Dec. 1, 2005 for International Application No. PCT/US2004/016715.

PCT International Search Report and the Written Opinion dated Apr. 14, 2004 for International Application No. PCT/US2003/22186.

PCT International Search Report and the Written Opinion dated Nov. 2, 2004 for International Application No. PCT/US2004/016715.

PCT International Search Report dated Feb. 16, 2003 for International Application No. PCT/US02/02651.

PCT International Search Report dated May 8, 2003 for International Application No. PCT/US02/34553.

PCT International Search Report dated May 9, 2003 for International Application No. PCT/US02/34277.

Ravetz, et al. "Properties of Solution TMI.TM. as an OMVPE Source," J. Electron, Mater. (USA) vol. 29, No. 1, Jan. 2000, pp. 156-160.

Ritala, et al. "Controlled Growth of TaN, $Ta_3N_5$, and $TaO_xN_y$ Thin Films by Atomic Layer Deposition," Chem. Mater., vol. 11, No. 7, 1999, pp. 1712-1718.

Ritala, et al. "Perfectly Conformal TiN and $Al_2O_3$ Films Deposited by Atomic Layer Deposition, Chemical Vapor Deposition," Jan. 1999, 5, No. 1, pp. 6-9.

Rossnagel, et al. "Plasma-Enhanced Atomic Layer Deposition of Ta and Ti for Interconnect Diffusion Barriers," J. Vac. Sci. Technol. B 18(4), Jul./Aug. 2000, pp. 2016-2020.

Shenai, et al. "Correlation of vapor pressure equation and film properties with trimethylindium purity for the MOVPE grown III-V compounds," Journal of Crystal Growth 248 (2003) pp. 91-98.

Sigma-Aldrich Certificate of Analysis, http://infonew.sigma-aldrich.com/cgi-bin/gx.cgi/Applogic+COfAInfo/Start?ProductNo=49 . . . , dated Mar. 16, 2003.

* cited by examiner

CHEMICAL PRECURSOR AMPOULE FOR VAPOR DEPOSITION PROCESSES

BACKGROUND OF THE INVENTION

1. Field of the Invention

Embodiments of the invention relate to a precursor source canister, such as an ampoule, for providing a vaporized chemical precursor to a processing chamber.

2. Description of the Related Art

Chemical vapor deposition (CVD) and atomic layer deposition (ALD) are techniques for forming materials on a substrate. The material is generally formed by the reaction of vapor phase chemicals on and/or near the surface of the substrate. Typically, CVD and ALD processes involve the delivery of gaseous reactants to the substrate surface where a chemical reaction takes place under temperature and pressure conditions favorable to the thermodynamics of the reaction. The type, composition, deposition rate, and thickness uniformity of the materials that may be formed using CVD or ALD processes are generally limited by the ability to deliver chemical reactants or precursors to the substrate surface.

The chemical precursor within the ampoule or canister is usually in a liquid state during the deposition process. However, the same chemical precursor may be a solid, liquid, or gas at ambient conditions. The chemical precursor typically contained within the ampoule or canister is heated to form a gaseous precursor. The gaseous reactants are typically flowed to a processing chamber having the substrate therein and used to form deposited materials.

Many ampoules and canisters are commercially available to store chemical precursors or to delivery chemical precursors to the processing chamber. However, these ampoules and canisters create challenges. For example, when the level of the chemical precursor is reduced by vaporization within an ampoule, the generation rate of the gaseous reactants decreases accordingly. Moreover, since the flow rate of the gaseous reactants heavily depends on the surface area of the interface between the chemical precursor and the carrier gas the decrease in the precursor level also decreases the interface area, thus lowering the flow rate of the gaseous reactants.

Therefore, there is a need for an ampoule or canister for providing a more constant or substantially constant flow rate of the gaseous reactants while the chemical precursor level decreases during a process.

SUMMARY OF THE INVENTION

Embodiments of the invention generally provide a canister apparatus capable of providing an extended pathway for carrier gas carrying vaporized chemical precursor. In one embodiment, the canister apparatus contains a sidewall, a top, and a bottom encompassing an interior volume therein, an inlet port and an outlet port in fluid communication with the interior volume, and an inlet tube extending into the canister and having an inlet end and an outlet end wherein the inlet end is coupled to the inlet port. The canister apparatus further contains a gas dispersion plate coupled to the outlet end of the inlet tube, wherein the gas dispersion plate is at an angle within a range from about 3° to about 80°, relative to a horizontal plane which is perpendicular to a vertical axis of the canister.

In another embodiment, a method for generating a gaseous chemical precursor used in a vapor deposition processing system is disclosed. The method includes heating a chemical precursor within an interior volume of the ampoule assembly to a predetermined temperature, flowing a carrier gas into the inlet port, through the inlet tube, and out of the outlet end of the inlet tube, flowing bubbles of the carrier gas along a lower surface of the gas dispersion plate while forming a process gas containing the chemical precursor and the carrier gas, and flowing the process gas out of the canister through the outlet port.

In another embodiment, a canister apparatus is disclosed. The canister apparatus includes a sidewall, a top, and a bottom encompassing an interior volume, an inlet port and an outlet port in fluid communication with the interior volume, and an inlet tube extending into the canister and having an inlet end and an outlet end, wherein the inlet end is coupled to the inlet port. The canister apparatus contains a gas dispersion plate coupled to the outlet end of the inlet tube, wherein the gas dispersion plate is positioned to direct a gas flow away from the outlet port and towards the sidewall of the canister.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to a canister, such as an ampoule, for containing a chemical precursor. In particular, the embodiments described herein relate to a canister assembly containing a baffle plate, which provides an extendable flow path for a carrier gas to absorb more precursor vapors. As such, the flow rate of the gaseous reactants remains constant or substantially constant even as the level of the chemical precursor decreases over time.

Figure 1A:
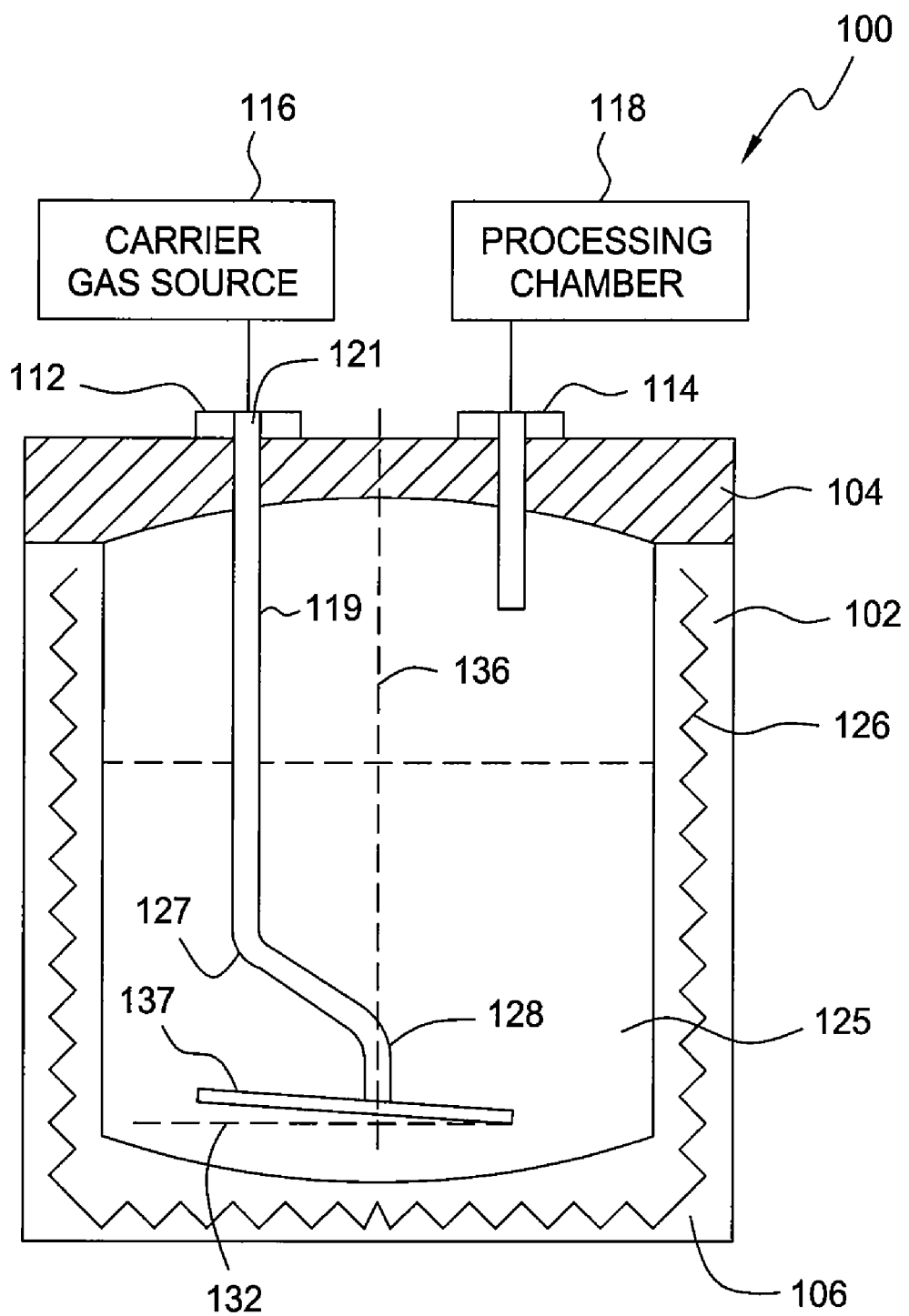
FIG. 1A is a schematic diagram illustrating a precursor source canister according to embodiments of the invention.

FIG. 1A illustrates one embodiment of a precursor source canister 100. The canister 100 contains sidewalls 102, a top 104, and a bottom 106 that surround an interior volume 108. The canister 100 also has an inlet port 112 and an outlet port 114. The inlet port 112 is coupled to and in fluid communication a carrier gas source 116, and the outlet port 114 is coupled to and in fluid communication a processing chamber 118. The canister 100 further contains an inlet tube 119 having an inlet end 121 and an outlet end 122. The inlet end 121 is coupled to the carrier source 116 while the outlet end 122 is connected to a baffle plate 124. The carrier gas source 116 supplies a carrier gas that is introduced into the interior volume 108 through the inlet tube 119. The canister 100 may adapted to contain a chemical precursor 125 within the interior volume 108. The chemical precursor 125 may be in a gaseous state, a liquid state, or a solid state at ambient conditions, such as pressure and temperature. However, the chemical precursor 125 is generally in a liquid state within the canister 100 while being used during a process. The canister 100 may further contain a heating element 126 within the sidewalls 102 for facilitating the vaporization of the chemical precursor 125. The heating element 126 is configured to be capable of heating the chemical precursor 125 to a predetermined temperature. Although FIG. 1A shows the heating element 126 is within the sidewalls 102, the heating element 126 could be a resistive heater disposed proximate the sidewalls 102. Alternatively, the canister 100 may be heated by an external heating apparatus, such as heating mantel or heating tape. The canister 100 may be heated to a predetermined temperature within a range from about 25° C. to about 350° C. In one specific example, the predetermined temperature may be within a range from about 40° C. to about 50° C. while the canister 100 is containing the tantalum precursor PDMAT. The introduced carrier gas is to flow the vaporized chemical precursor in the form of the gaseous reactant through the outlet port 114 to the processing chamber 118.

Examples of suitable chemical precursors 125 disposed in the interior volume 108 and/or delivered from the precursor source canister 100 include titanium tetrachloride ($TiCl_4$), tetrakis(dimethylamino)titanium (TDMAT, $(Me_2N)_4Ti$)), tetrakis(diethylamino)titanium (TEMAT, $(Et_2N)_4Ti$), bis(ethylcyclopentadienyl)ruthenium ($(EtCp)_2Ru$), bis(2,4-dimethylpentadienyl)ruthenium, bis(2,4-diethylpentadienyl)ruthenium, tetrakis(dimethylamino)hafnium (TDMAH, $(Me_2N)_4Hf$), tetrakis(diethylamino)hafnium (TDEAH, $(Et_2N)_4Hf$), tetrakis(methylethylamino)hafnium (TMEAH, $(MeEtN)_4Hf$), tertbutylimino-tris(dimethylamino)tantalum (TBTDAT, $(^tBuN)Ta(NMe_2)_3$), tertbutylimino-tris(diethylamino)tantalum (TBTDET, $(^tBuN)Ta(NEt_2)_3$), tertbutylimino-tris(methylethylamino)tantalum (TBTMET, $(^tBuN)Ta(NMe_2)_3$), pentakis(dimethylamino)tantalum (PDMAT, $Ta(NMe_2)_5$), tertiaryamylimino-tris(dimethylamino)tantalum (TAIMATA, $(^tAmylN)Ta(NMe_2)_3$), wherein ($^tAmyl$) is the tertiaryamyl group ($C_5H_{11}$ or $CH_3CH_2C(CH_3)_2$), derivatives thereof, or combinations thereof. Other suitable exemplary precursor source materials include water, hydrogen peroxide ($H_2O_2$), ammonia ($NH_3$), hydrazine ($N_2H_4$). Suitable silicon precursor source materials include silane ($SiH_4$), disilane ($Si_2H_6$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), or derivatives thereof.

The inlet tube 119 may contain at least one bend. In one embodiment, the inlet tube 119 has a first bend 127 bent towards the sidewalls 102, and a second bend 128 bent towards the bottom 106 of the canister 100. The second bend 128 is between the outlet end 122 and the first bend 127. In one example, the first bend 127 and the second bend 128 collectively may form an S-shaped bend.

Figure 1B:
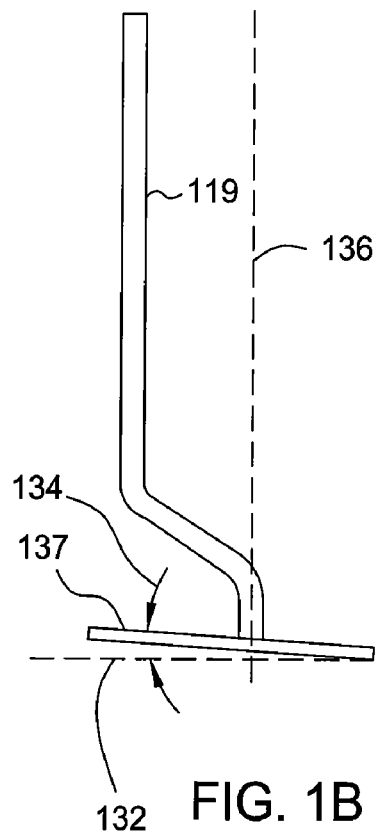
FIG. 1B is a schematic diagram showing the inlet tube with the baffle plate according to embodiments of the invention.

FIG. 1B is a schematic diagram depicting the inlet tube 119 according to embodiments of the invention. The baffle plate 124 may be positioned at an angle 134 relative to a horizontal plane 132 which is perpendicular to a vertical axis 136 of the canister 100, as depicted in FIGS. 1A-1B. In one embodiment, the angle 134 may be at an angle within a range from about 3° to about 80°, preferably, from about 4° to about 40°, and more preferably, from about 5° to about 10°. The baffle plate 124 is positioned at the angle 134 to increase the flow path of the carrier gas for becoming saturated with the vaporized chemical precursor while flowing towards the outlet port 114. With the baffle plate 124, the extended path of the carrier gas carrying the vaporized chemical precursor to the outlet port 114 includes a bottom surface 137 of the baffle plate 124. As such, more vaporized chemical precursor could be getting absorbed by the carrier gas before being flown to the outlet port 114. Therefore, despite the generation rate of the vaporized chemical precursor under the predetermined temperature and pressure decreases as the result of the decreasing level of the chemical precursor 125 the flow rate of the vaporized chemical precursor to the processing chamber 118 could remain steady.

The chemical precursor 125 is usually contained within the canister 100 at a level higher than the baffle plate 124. The introduced carrier gas could be in the form of bubbles absorbing the vaporized chemical precursor before moving along the extended pathway to the surface of the chemical precursor 125. The carrier gas may be preheated before being introduced into the interior volume 108 or the chemical precursor 125. The carrier gas may be argon, nitrogen, hydrogen, helium, or mixtures thereof. The baffle plate 124 may be made of or contain a material such as steel, stainless steel, aluminum, or alloys thereof.

Figure 1C:
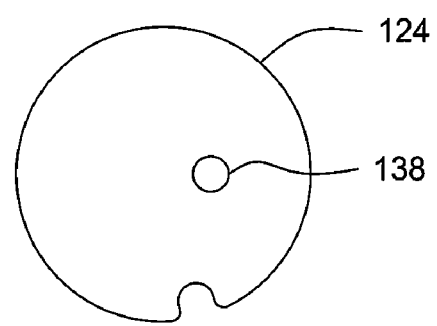
FIG. 1C is a bottom view of the baffle plate according to embodiments of the invention.

FIG. 1C is a bottom view of the baffle plate 124 according to embodiments of the invention. The baffle plate 124 includes a through hole 138 coupled to the inlet tube 119. The carrier gas could be also introduced into the chemical precursor 124 via the through hole 138 when the chemical precursor submerges the baffle plate 124. Alternatively, the carrier gas could be introduced into the interior volume 108 via the through hole 138 when the chemical precursor 125 no longer submerges the baffle plate 124. Either way, the baffle plate could be directing the carrier gas bubbles carrying the vaporized chemical precursor away from the outlet port 114 but towards the sidewalls 102. Though not shown in FIG. 1C, the inlet tube 119 in one embodiment could be protruding through the baffle plate 124. In such embodiment, the through hole 138 allows the protrusion of the inlet tube 119. In another embodiment where the inlet tube 119 does not protrude through the baffle plate 124, the through hole 138 serves as a channel for the introduction of the carrier gas.

Figure 2A:
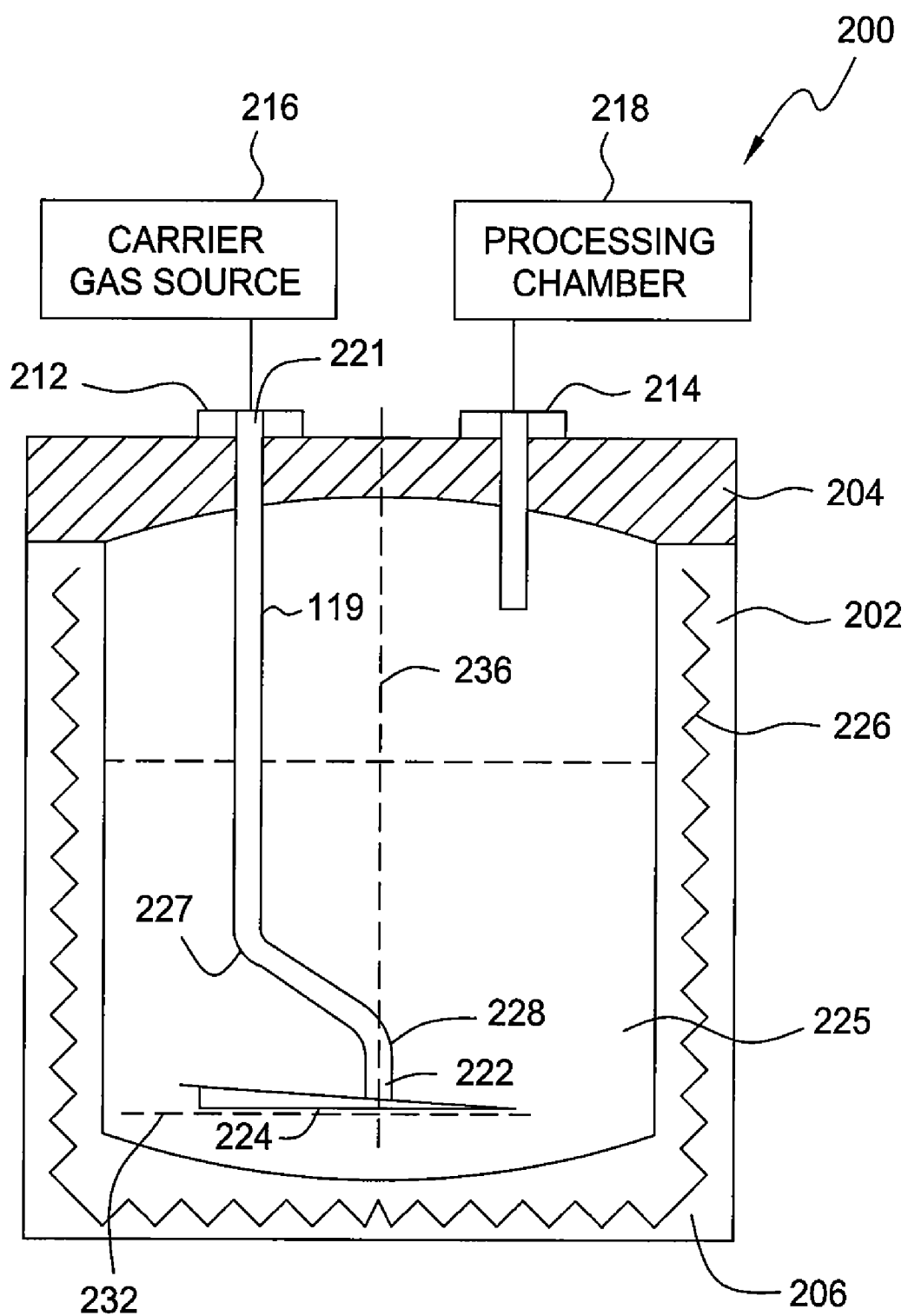
FIG. 2A is a schematic diagram illustrating another precursor source canister according to embodiments of the invention.

FIG. 2A is a schematic diagram illustrating another precursor source canister 200 according to embodiments of the invention. The canister 200 contains sidewalls 202, a top 204, and a bottom 206 that surround an interior volume 208. The canister 200 also has an inlet port 212 and an outlet port 214. The canister 200 also has an inlet tube 219 connected to the inlet port 212. The inlet port 212 is further coupled to a carrier gas source 216, and the outlet port 214 is coupled to a processing chamber 218. The inlet tube 219 includes an inlet end 221 and an outlet end 222. The inlet end 221 of the inlet tube 219 couples to the carrier source 216. The outlet end 222 of the inlet tube 219 connects to a baffle plate 224. The carrier gas source 216 supplies a carrier gas that is introduced into the interior volume 208 through an inlet tube 219. The interior volume 208 of the canister 200 is adapted to contain a chemical precursor 225, which may be in a state of solid, liquid, or gas. The canister 200 further includes a heating element 226 for facilitating the vaporization of the chemical precursor 225. In one embodiment, the chemical precursor 225 is a pentakis(dimethylamino)tantalum (PDMAT, $Ta(NMe_2)_5$).

The heating element 226 is configured to be capable of heating the chemical precursor 225 to a predetermined temperature. The ampoule may be heated to a temperature within a range from about 25° C. to about 350° C. In one specific example, the predetermined temperature may be within a range from about 40° C. to about 50° C. while the canister 100 is containing the tantalum precursor PDMAT. Despite FIG. 2A shows the heating element 226 within the sidewalls 202, it is well understood that the heating element 226 could be a resistive heater disposed proximate the sidewalls 202. The introduced carrier gas is to flow the vaporized chemical precursor in the form of the gaseous reactant through the outlet port 214 to the processing chamber 218. Furthermore, the inlet tube 219 is bent at least once. The inlet tube 219 includes a first bend 227 towards the sidewalls 202 and a second bend 228 bent from the sidewalls 202 to the general direction of the bottom 206 of the canister 200. The second bend 228 is between the first bend 227 and the outlet end 222 of the inlet tube 219.

Figure 2B:
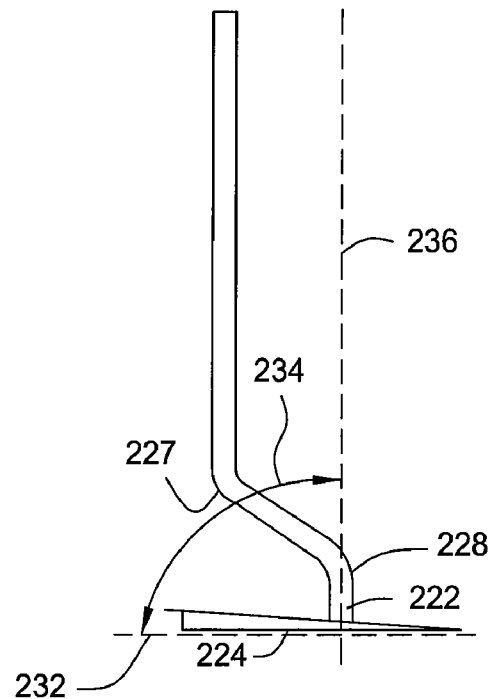
FIG. 2B is a schematic diagram illustrating the inlet tube with the baffle plate according to embodiments of the invention.

FIG. 2B is a schematic diagram depicting the inlet tube 219 according to embodiments of the invention. The baffle plate 224 may be positioned at an angle 234 relative to a horizontal plane 232 which is perpendicular to a vertical axis 236 of the canister 200, as depicted in FIGS. 2A-2B. In one embodiment, the angle 134 may be at an angle within a range from about 3° to about 80°, preferably, from about 4° to about 40°, and more preferably, from about 5° to about 10°. The baffle plate 224 is positioned at the angle 234 to increase the flow path of the carrier gas for becoming saturated with the vaporized chemical precursor while flowing towards the outlet port 214.

The placement of the baffle plate 224 provides an extended pathway for the carrier gas bubbles to flow and to absorb the vaporized chemical precursor. The baffle plate 224, the extended path of the carrier gas flowing with the vaporized chemical precursor to the outlet port 214 includes along a bottom surface 237 of the baffle plate 224. The carrier gas containing the vaporized chemical precursor flows along the bottom surface 237. In one example, the baffle plate 224, helps direct the carrier gas containing the vaporized chemical precursor towards the sidewalls 202, before getting to the outlet port 214. The extended pathway to the outlet port 214 provides more vaporized chemical precursor being absorbed by the carrier gas to form more gaseous reactant. Therefore, the flow rate of the gaseous reactant could remain consistent regardless of the drop in the level of the chemical precursor 225 over the course of the process facilitated by the canister 200.

The chemical precursor 225 is usually contained in the canister 200 at a level higher than the baffle plate 224. The introduced carrier gas could be in the form of bubbles which absorb the vaporized chemical precursor. The carrier gas may be preheated before being introduced into the interior volume 208 or the chemical precursor 225. In one embodiment, the carrier gas may be argon, nitrogen, hydrogen, helium, or mixtures thereof. The baffle plate 224 may contain or be made of a material such as steel, stainless steel, aluminum, or alloys thereof.

Figure 2C:
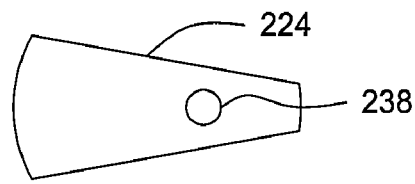
FIG. 2C is a bottom view of the baffle plate according to embodiments of the invention.

FIG. 2C is a bottom view of the baffle plate 224 according to embodiments of the invention. The baffle plate 224 includes a through hole 238 via which the carrier gas could be introduced into the interior volume 208 or the chemical precursor 225 depending on the level of the chemical precursor 225. In one embodiment, the baffle plate 224 directs the carrier gas bubbles carrying the vaporized chemical precursor away from the outlet port 214 and towards the sidewalls 202. Thus, the vaporized chemical precursor has more time in order to be absorbed by the carrier gas before being carried to the outlet port 214.

In an alternative embodiment, not shown in FIG. 2C, the inlet tube 219 may protrude through the baffle plate 224. In another embodiment, the inlet tube 219 does not protrude through the baffle plate 224 and the through hole 238 serves as a channel for the introduction of the carrier gas.

Figure 2D:
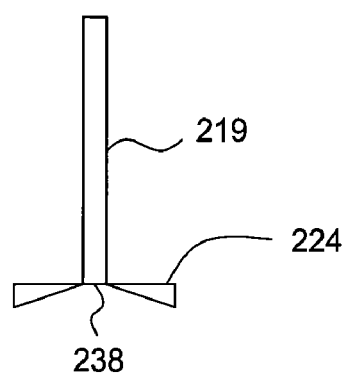
FIG. 2D is a rear view of the inlet tube with the baffle plate according to embodiments of the invention.

FIG. 2D is a rear view of the inlet tube 219 with the baffle plate 224 according to one embodiment of the invention. The carrier gas from the carrier gas source 216 may be introduced through the inlet tube 219 and the through hole 238 of the baffle plate 224 before reaching into the interior volume 208 or the chemical precursor 225.

Figure 3:
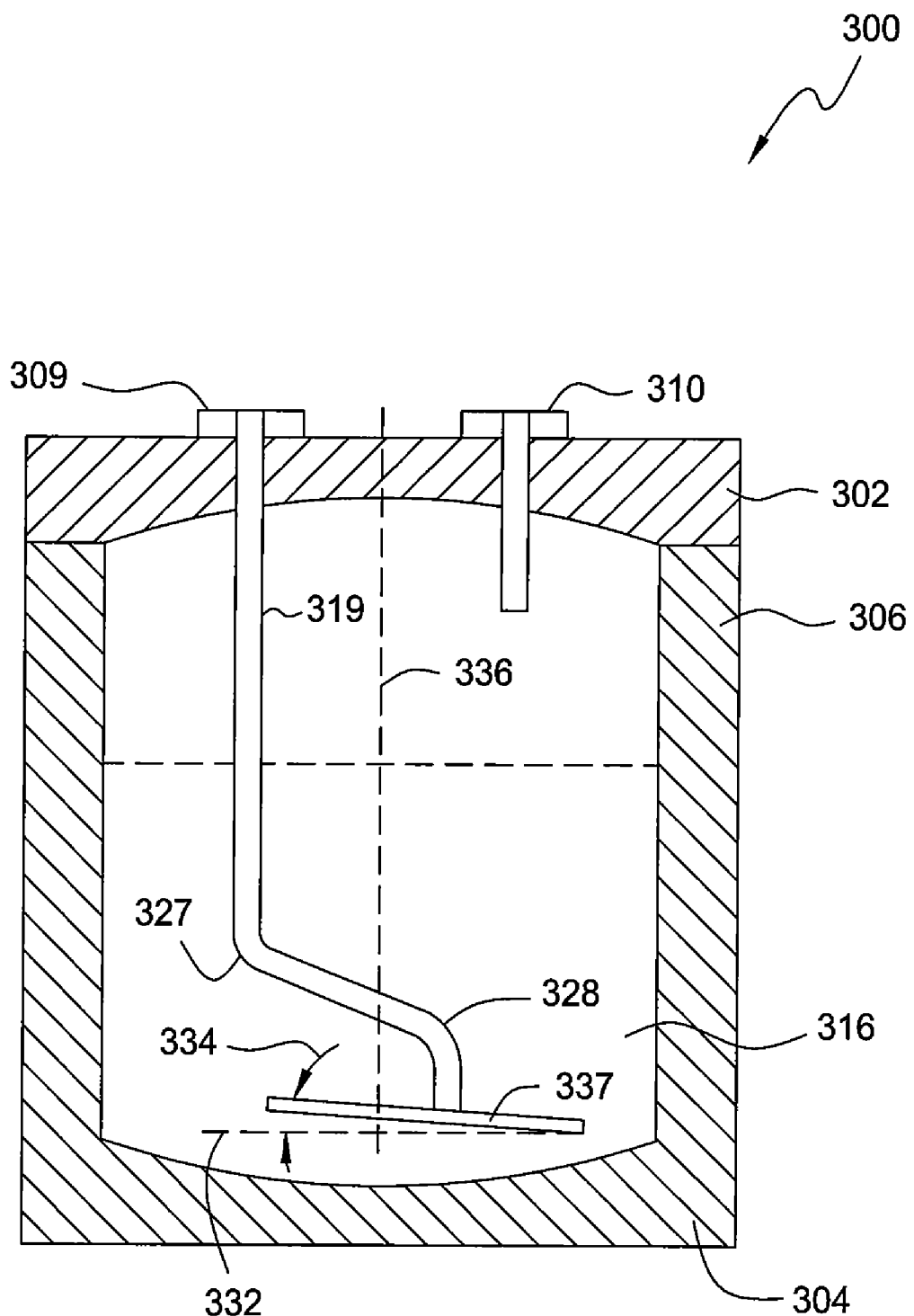
FIG. 3 is a schematic diagram illustrating another precursor source canister according to embodiments of the invention.

FIG. 3 is a schematic diagram showing another precursor source canister 300 according to embodiments of the invention. The canister 300 includes a top 302, a bottom 304, and sidewalls 306 that enclose an interior volume 308. The canister 300 further has an inlet port 309, an outlet port 310, and an inlet tube 312 coupled to the inlet port 309. The canister 300 further contains a baffle plate (gas dispersion plate) 314 connected to the inlet tube 312. In one embodiment, the baffle plate 314 locates at the end of the inlet tube 312. In another embodiment, the inlet tube 312 protrudes through the baffle plate 314. The inlet tube 312 is configured to introduce a carrier gas into the interior volume 308 or a chemical precursor 316 contained within the interior volume 308. The baffle plate 314 is configured to extend the path for the carrier gas bubbles that carry the vaporized chemical precursor to the outlet port 310. More specifically, the carrier gas may be introduced either into the interior volume 308 or the chemical precursor 316 for carrying the vaporized chemical precursor, which flows along a bottom surface 317 of the baffle plate 314 before flowing towards the outlet port 310. As such, more vaporized chemical precursor is absorbed by the carrier gas and the flow rate of the chemical precursor from the output port 310 may remain consistent even the level of the chemical precursor 316 decreases as the result of the process performed in a processing chamber (not shown in FIG. 3).

The inlet tube 312 has a first bend 318 towards the sidewalls 306 and a second bend 322 towards the bottom 304 of the canister 300. The baffle plate 314 may be positioned at an angle 325 relative to a horizontal plane 332 which is perpendicular to a vertical axis 327 of the canister 300. In one embodiment, the angle 325 may be at an angle within a range from about 3° to about 80°, preferably, from about 4° to about 40°, and more preferably, from about 5° to about 10°. The baffle plate 314 is positioned at the angle 325 to increase the flow path of the carrier gas for becoming saturated with the vaporized chemical precursor while flowing towards the outlet port 310.

Figure 4:
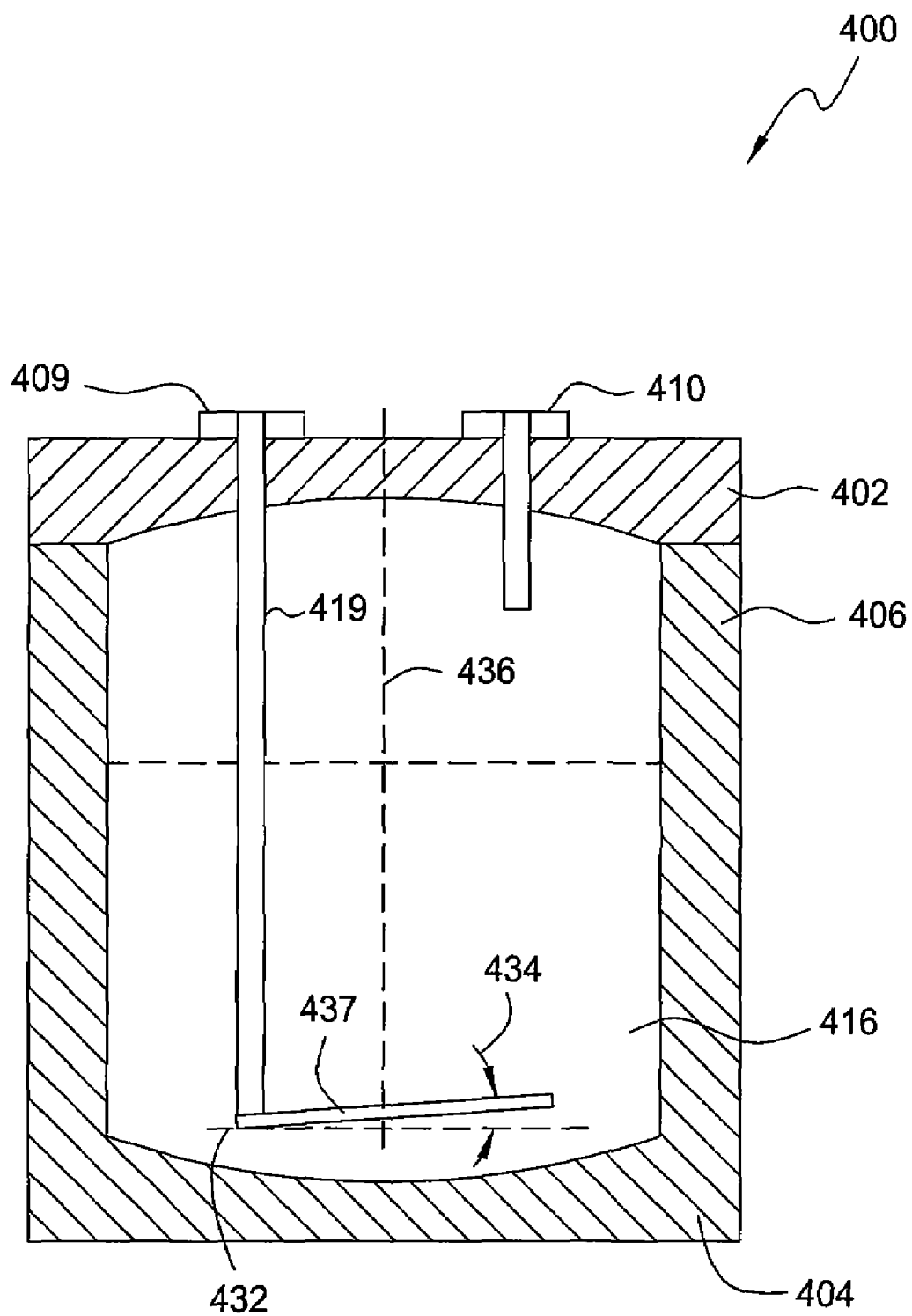
FIG. 4 is a schematic diagram illustrating another precursor source canister according to embodiments of the invention.

FIG. 4 is another schematic diagram illustrating another precursor source canister 400 according to embodiments of the invention. The canister 400 includes a top 402, a bottom 404, sidewalls 406 that enclose an interior volume 408. The canister 400 further has an inlet port 409, an outlet port 410, and an inlet tube 412 coupled to the inlet port 409. The canister 400 further contains a baffle plate 414 connected to the inlet tube 412. In one embodiment, the baffle plate 414 locates at the end of the inlet tube 412. In another embodiment, the inlet tube 412 protrudes through the baffle plate 414. The inlet tube 412 is configured to introduce a carrier gas into the interior volume 408 or a chemical precursor 416 contained within the interior volume 408. The baffle plate 414 is configured to extend the path for the carrier gas bubbles that carry the vaporized chemical precursor to the outlet port 410. More specifically, the carrier gas may be introduced either into the interior volume 408 or the chemical precursor 416 for carrying the vaporized chemical precursor, which flows along a bottom surface 417 of the baffle plate 414 before flowing towards the outlet port 410. As such, more vaporized chemical precursor could be absorbed by the carrier gas and the flow rate of the chemical precursor from the output port 410 may remain consistent despite the decreasing level of the chemical precursor 416 during the ongoing process.

In another embodiment, the baffle plate 417 may be positioned at an angle 424 relative to a horizontal plane 422 which is perpendicular to a vertical axis 426 of the canister 400. In one embodiment, the angle 424 may be at an angle within a range from about 3° to about 80°, preferably, from about 4° to about 40°, and more preferably, from about 5° to about 10°. The baffle plate 417 is positioned at the angle 424 to increase the flow path of the carrier gas for becoming saturated with the vaporized chemical precursor while flowing towards the outlet port 410.

While the foregoing is directed to embodiments of the invention, other and further embodiments of the invention thus may be devised without departing from the basic scope thereof, and the scope thereof is determined by the claims that follow.

The invention claimed is:

1. An apparatus for generating a gaseous chemical precursor usable in a vapor deposition processing system, comprising:
    a canister comprising a sidewall, a top, and a bottom encompassing an interior volume therein;
    an inlet port and an outlet port in fluid communication with the interior volume;
    an inlet tube extending into the canister and having an inlet end and an outlet end, wherein the inlet end is coupled to the inlet port; and
    a gas dispersion plate coupled to the outlet end of the inlet tube, wherein a bottom surface of the gas dispersion plate is at an angle of about 3° to about 80° above a horizontal plane that extends through the outlet end and is perpendicular to a vertical axis of the canister.

2. The apparatus of claim 1, wherein the angle is within a range from about 4° to about 40°.

3. The apparatus of claim 2, wherein the angle is within a range from about 5° to about 10°.

4. The apparatus of claim 1, wherein the gas dispersion plate is positioned to direct a gas flow away from the outlet port and towards the sidewall of the canister.

5. The apparatus of claim 1, wherein the inlet tube comprises at least one bend.

6. The apparatus of claim 5, wherein the inlet tube comprises a first bend towards the sidewall of the canister.

7. The apparatus of claim 6, wherein the inlet tube comprises a second bend towards the bottom of the canister, and the second bend is between the first bend and the outlet end of the inlet tube.

8. The apparatus of claim 7, wherein the first and second bends form a S-shaped bend.

9. The apparatus of claim 1, wherein the inlet tube protrudes through the gas dispersion plate.

10. The apparatus of claim 1, wherein the interior volume of the canister contains pentakis(dimethylamino)tantalum.

11. The apparatus of claim 1, wherein the gas dispersion plate comprises a material selected from the group consisting of steel, stainless steel, aluminum, and alloys thereof.

12. An apparatus for generating a gaseous chemical precursor usable in a vapor deposition processing system, comprising:
    a canister comprising a sidewall, a top, and a bottom encompassing an interior volume therein;
    an inlet port and an outlet port in fluid communication with the interior volume;
    an inlet tube extending into the canister and having an inlet end and an outlet end, wherein the inlet end is coupled to the inlet port; and
    a gas dispersion plate coupled to the outlet end of the inlet tube, wherein the gas dispersion plate is at an angle of about 3° to about 80° relative to a horizontal plane which is perpendicular to a vertical axis of the canister, and wherein at least one edge of the gas dispersion plate is higher than the vertical position of the outlet end.

13. The apparatus of claim 12, wherein the angle is within a range from about 4° to about 40°.

14. The apparatus of claim 13, wherein the angle is within a range from about 5° to about 10°.

15. The apparatus of claim 12, wherein the gas dispersion plate is positioned to direct a gas flow away from the outlet port and towards the sidewall of the canister.

16. The apparatus of claim 12, wherein the inlet tube comprises at least one bend.

17. The apparatus of claim 16, wherein the inlet tube comprises a first bend towards the sidewall of the canister.

18. The apparatus of claim 17, wherein the inlet tube comprises a second bend towards the bottom of the canister, and the second bend is between the first bend and the outlet end of the inlet tube.

19. An apparatus for generating a gaseous chemical precursor usable in a vapor deposition processing system, comprising:
    a canister comprising a sidewall, a top, and a bottom encompassing an interior volume therein;
    an inlet port and an outlet port in fluid communication with the interior volume;
    an inlet tube extending into the canister and having an inlet end and an outlet end, wherein the inlet end is coupled to the inlet port; and
    a gas dispersion plate coupled to the outlet end of the inlet tube, wherein the gas dispersion plate is at an angle of about 3° to about 80° relative to a horizontal plane which is perpendicular to a vertical axis of the canister, and wherein a first end of the gas dispersion plate is higher than the vertical position of the outlet end, and a second end of the gas dispersion plate is lower than the vertical position of the outlet end.

20. The apparatus of claim 19, wherein the angle is within a range from about 4° to about 40°.

21. The apparatus of claim 20, wherein the angle is within a range from about 5° to about 10°.

22. The apparatus of claim 19, wherein the gas dispersion plate is positioned to direct a gas flow away from the outlet port and towards the sidewall of the canister.

23. The apparatus of claim 19, wherein the inlet tube comprises at least one bend.

24. The apparatus of claim 23, wherein the inlet tube comprises a first bend towards the sidewall of the canister.

25. The apparatus of claim 24, wherein the inlet tube comprises a second bend towards the bottom of the canister, and the second bend is between the first bend and the outlet end of the inlet tube.

* * * * *